United States Patent
Baumann et al.

(10) Patent No.: US 7,434,189 B2
(45) Date of Patent: Oct. 7, 2008

(54) I/O DRIVER POWER DISTRIBUTION METHOD FOR REDUCING SILICON AREA

(75) Inventors: Donald Baumann, San Jose, CA (US); Subhas Bothra, Fremont, CA (US)

(73) Assignee: Broadcom Corporation, Irvine, CA (US)

( * ) Notice: Subject to any disclaimer, the term of this patent is extended or adjusted under 35 U.S.C. 154(b) by 428 days.

(21) Appl. No.: 11/254,903

(22) Filed: Oct. 20, 2005

(65) Prior Publication Data

US 2007/0090401 A1    Apr. 26, 2007

(51) Int. Cl.
    *G06F 17/50*    (2006.01)
(52) U.S. Cl. .................. 716/11; 716/8; 716/13
(58) Field of Classification Search ............ 716/1–2, 716/7–14
    See application file for complete search history.

(56) References Cited

U.S. PATENT DOCUMENTS

| 6,925,627 | B1 * | 8/2005 | Longway et al. ............. 716/13 |
| 2001/0049813 | A1 * | 12/2001 | Chan et al. ...................... 716/8 |
| 2005/0091629 | A1 * | 4/2005 | Eisenstadt et al. ............ 716/13 |

* cited by examiner

*Primary Examiner*—Paul Dinh
(74) *Attorney, Agent, or Firm*—Garlick Harrison & Markison (57) ABSTRACT

Embodiments of the present invention provide an integrated circuit (IC) in which power to input output (IO) drivers may be distributed within unused areas over macro processing circuits. This IC includes a long distance power and ground distribution network, an input output (IO) power and ground distribution network, a number of macro processing circuits, and IO circuits. The long distance power and ground distribution network electrically couples to the IO power and ground distribution network. Both the power and ground distribution networks may be located within the upper level conductive layers. IO power and ground distribution network locally supplies power and ground to IO circuits. Macro processing circuits may be located beneath the power distribution network as some macro processing circuits do not require access to upper level conductive layers. By placing these macro processing circuits beneath these power distribution networks, die size may be reduced.

18 Claims, 8 Drawing Sheets

Prior Art

FIG. 1

Prior Art

I/O DRIVER POWER DISTRIBUTION METHOD FOR REDUCING SILICON AREA

TECHNICAL FIELD OF THE INVENTION

The present invention relates generally to the integrated circuits, and more particularly to the distribution of power and signals to an IC.

BACKGROUND OF THE INVENTION

Figure 1:
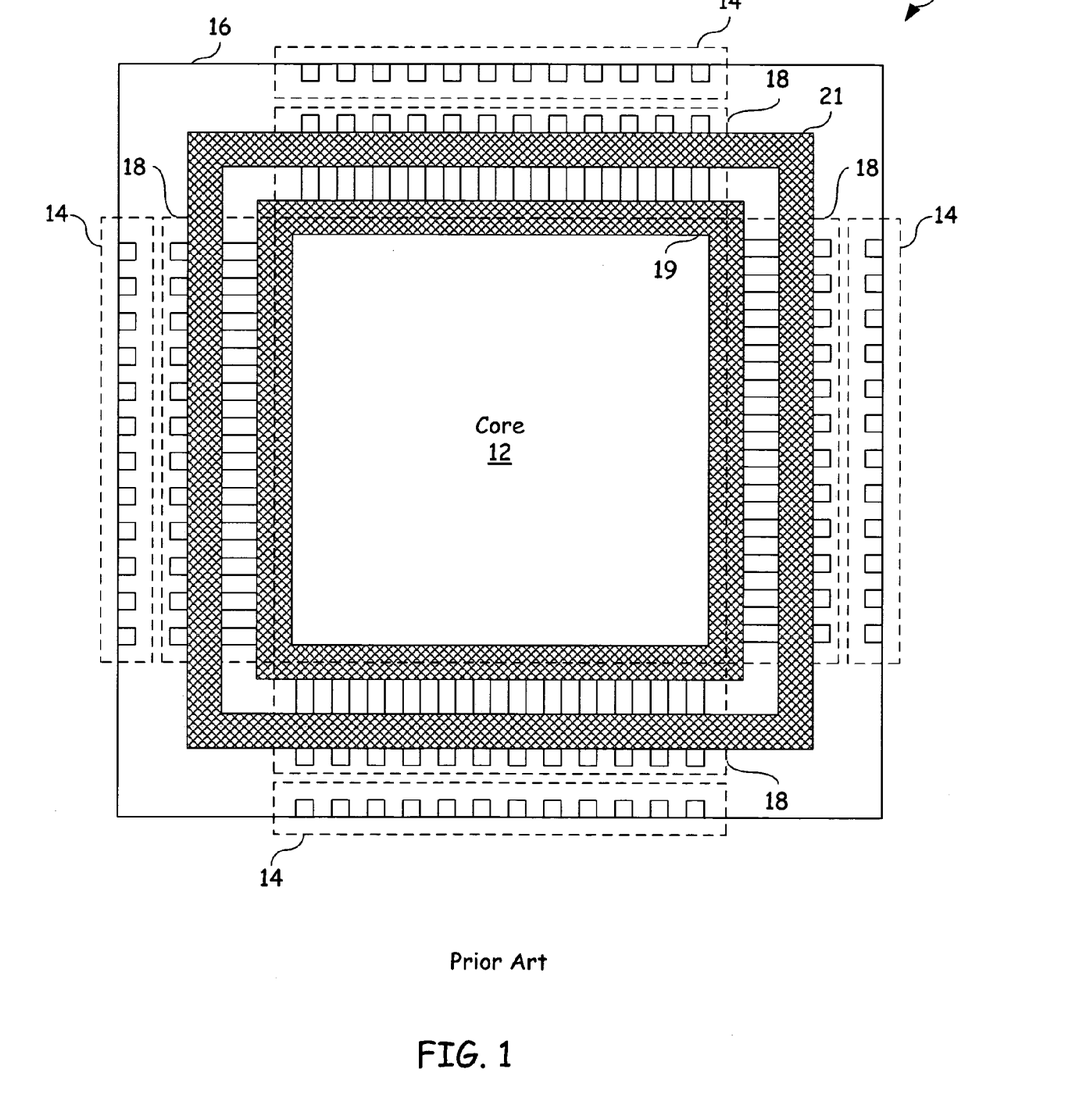
FIG. 1 provides a block diagram describing the architecture of a system on a chip (SoC) integrated circuit (IC)
Figure 2:
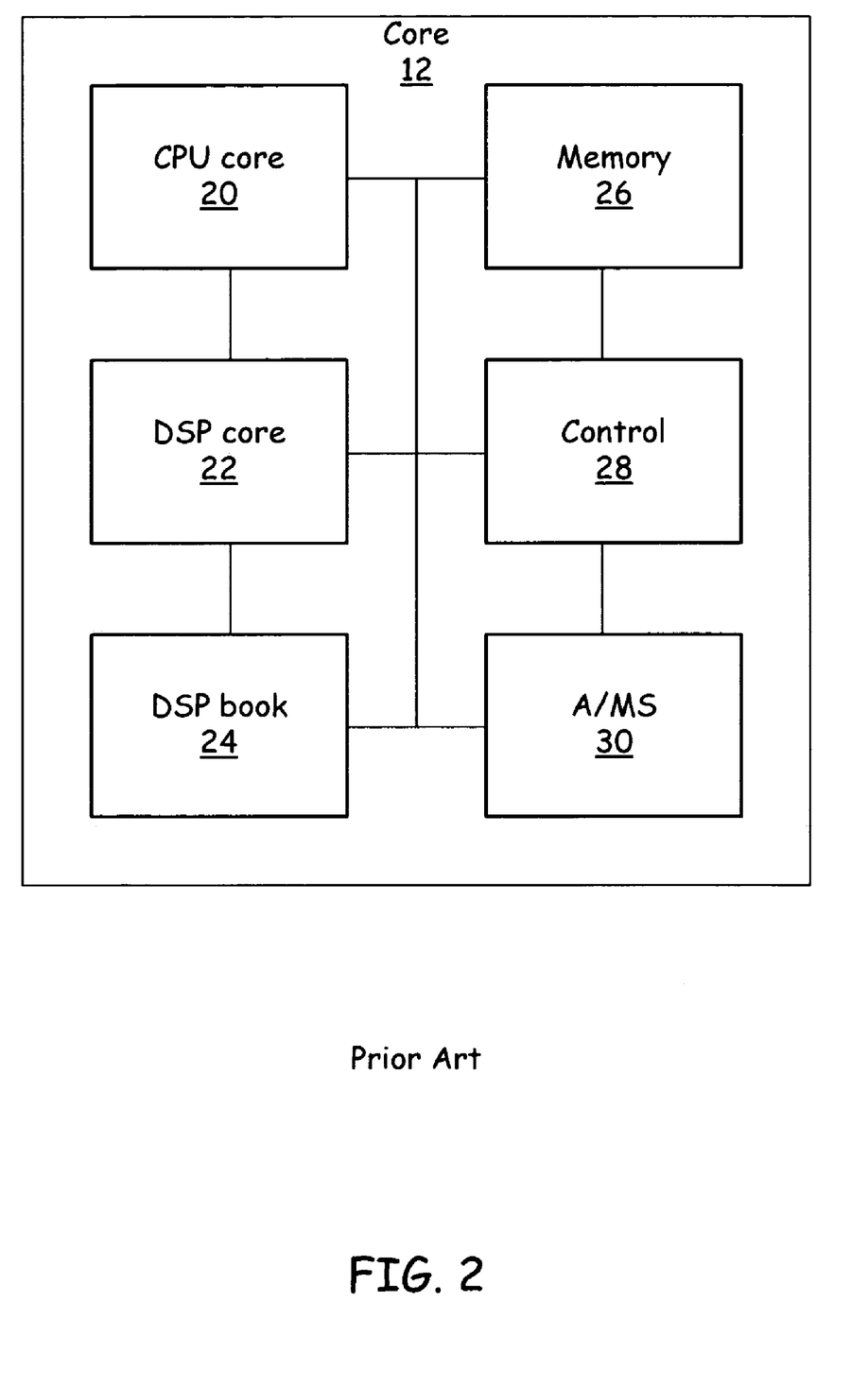
FIG. 2 provides a block diagram describing the macro processing circuits typically contained within the core of the SoC of FIG. 1.

Integrated circuits (IC) are increasing in complexity. The number of devices incorporated within a single IC is greatly increasing and causing the size and complexity of individual ICs to increase. As a result of increased component density and improved fabrication technology is the realization of system on chip (SoC) applications. FIG. 1 depicts such an IC or SoC 10 that may include many logic and memory functions within the SoC. For example, core 12, as further described in FIG. 2, may include a CPU core 20, DSP core 22, DSP book 24, memory 26, control circuitry 28 and analog/mixed signal circuitry 30. These are just examples of the types of systems or components that may be integrated into a signal chip.

Complexities are associated with the realization of SoC designs. Incorporating diverse components previously contained within printed circuit board (PCB) involves confronting many design challenges. The discrete components may be designed for different entities using different tools. Other difficulties lie in fabrication. In general, fabrication processes of memory may differ significantly from those associated with logic circuits. For example, speed may be the priority associated with a logic circuit while current leakage of the stored charge is of priority for memory circuits. Therefore, multi-level interconnect schemes using five to six levels of metal are essential for logic ICs in order to offer improved speed, while memory circuits may need only two to three levels.

In order for the IC to be useful, the IC must have physical connections to the outside world. Two extremes in IC development support different types of interfaces to external devices. Low cost packaging which supports low pin count is achieved with traditional wire bond attached chips. High cost packaging may support high pin count in the case of flip chips.

With wire bond attached chips such as IC 10 as illustrated in FIG. 1, pads 14, I/O cells 18 are placed at the edge of die 16. I/O cells 18 may be decoupled from core circuitry 12 by isolation structures. This ensures that electrical noise is not coupled into core 12. Additional circuitry for latch up and electrostatic discharge (ESD) protection may be placed within cells that form a ring around the dye which is called the I/O pad ring. Bond wire pads 14 are placed at the edge of the die outside I/O circuitry. Thus, this geometry further increases the size of die 16, and may [insert complete]

Traditional ICs fall into two general categories, core-limited and I/O or pad limited. A core-limited chip is one where the size of the chip is dependent on the amount of logic contained therein. The perimeter of the chip is more than sufficient to support the I/O, clock, power, and ground bonding pads surrounding the core. A pad-limited IC's size is dictated by the bonding pads on the die's perimeter, wherein pads 14 are as close as possible, consistent with the IC's design rules. Thus pad limited IC's often contain wasted open space within die.

Advances in device density within the core have made it possible to reduce core size of IC devices. However, reduced I/O pad pitch (the pitch is typically defined as the repeat distance between adjacent I/O pads 14) has been hard to achieve because of packaging limitations. Therefore, as a result, IC designs that are I/O intensive tend to have a die size significantly greater than that of the core. This leads to poor utilization of the silicon area and a reduced number of die per wafer.

SUMMARY OF THE INVENTION

Embodiments of the present invention are directed to systems and methods that are further described in the following description and claims. Advantages and features of embodiments of the present invention may become apparent from the description, accompanying drawings and claims.

BRIEF DESCRIPTION OF THE DRAWINGS

For a more complete understanding of the present invention and the advantages thereof, reference is now made to the following description taken in conjunction with the accompanying drawings in which like reference numerals indicate like features and wherein.

DETAILED DESCRIPTION OF THE INVENTION

Preferred embodiments of the present invention are illustrated in the FIGUREs, like numerals being used to refer to like and corresponding parts of the various drawings.

Embodiments of the present invention provide an integrated circuit (IC) (or chip) architecture or a method of distributing power and ground to input/output (I/O) circuit within an IC that substantially addresses the previously identified problems, as well as others. Particularly; embodiments of the present invention may provide a different approach to distributing power to I/O drivers that may result in smaller chip area, better control to minimize signal noise resulting from simultaneous switching outputs (SSO), and also enables further area reduction through reduced number of power pads. In conventional I/O and power distribution schemes, such as that employed by IC or SoC of FIG. 1, silicon area is wasted within a pad-limited IC architecture.

I/O drivers 18, the primary means by which a chip drives output signals, must have low resistance access to chip ground and power. The conventional approach to power distribution to the I/O drivers is through the I/O rings 19 and 21. Each I/O is designed such that power busing is included over the width of the I/O in the orthogonal direction so that abutting I/Os create continuous power busing across all I/O drivers. Generally, power distribution within and across I/O cells 18 occurs in higher levels of metal. In a 6-layer metal process, for example, metal layer 5 and metal layer 6 may be used for power distribution. The wider the metal power distribution bus, the lower the resistance orthogonal to the I/O cells. When attempting to decrease I/O height, power busing resistance increases must be taken into account and may limit the amount the I/O height can shrink.

To supply current to the I/O drivers, power I/Os bring power and ground from the IC package to I/O rings. Sufficient number of power/ground I/Os are required to supply a low enough resistance path to all I/O drivers. This ensures that signal voltage levels will arrive at valid logic levels within chip timing specifications. Also sufficient power/ground I/Os are required to address SSO (keeping logic levels valid for I/O signals which remain quiet when others transition.) Electro-Static Discharge (ESD), providing sufficiently low resistance path from any I/O pad to any other I/O pad must also be addressed. ESD issues usually involve adding power and/or ground pads, which contain ESD diodes within the cell, to reduce resistance between pairs of pads.

Figure 3:
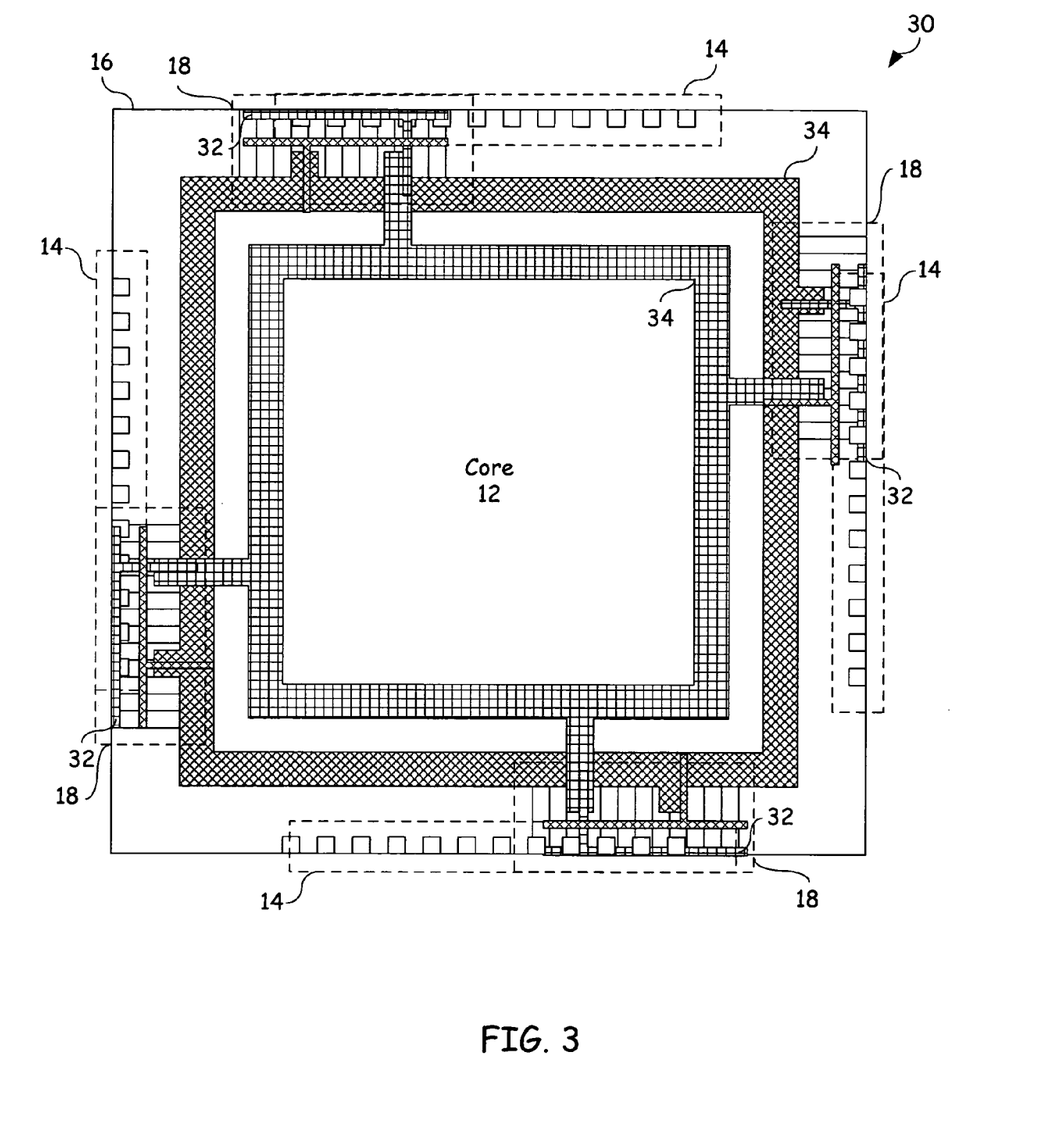
FIG. 3 provides a block diagram describing the architecture of a SoC IC in accordance with an embodiment of the present invention.

FIG. 3 depicts an embodiment of the present invention where power and ground can be routed to the I/O drivers outside I/O driver cell 18. This allows the I/O ring to be thinner and the I/O height to decrease.

here I/O ring power distribution purpose may change from distributing power over large distances and for handling large ESD currents to local power distribution only. An addition power/ground distribution network 32 handles local power distribution, while a smaller I/O power ring 34 handles long distance power distribution and ESD current issues. In other words, the bulk of the responsibility of I/O current distribution is moved outside the I/O cells and allows the overall die 16 size to be reduced.

I/O cells are designed with orthogonal power routing so that power ring resistance of several adjacent I/Os is low. If the I/O has a small height, thus thinner power busing across the I/O, then more power/ground pads are needed to ensure a low enough resistance from power/ground to each I/O driver. If the I/O height is increased only to allow more power/ground current to flow across it then silicon area may be wasted. By moving the bulk of the power current carrying capacity outside the I/O cells, the I/O cell height may be able to be decreased, and/or number power/ground pads may be reduced, each resulting in reduced silicon area. This allows the number of pads in a potentially pad limited IC to be reduced.

Figure 4:
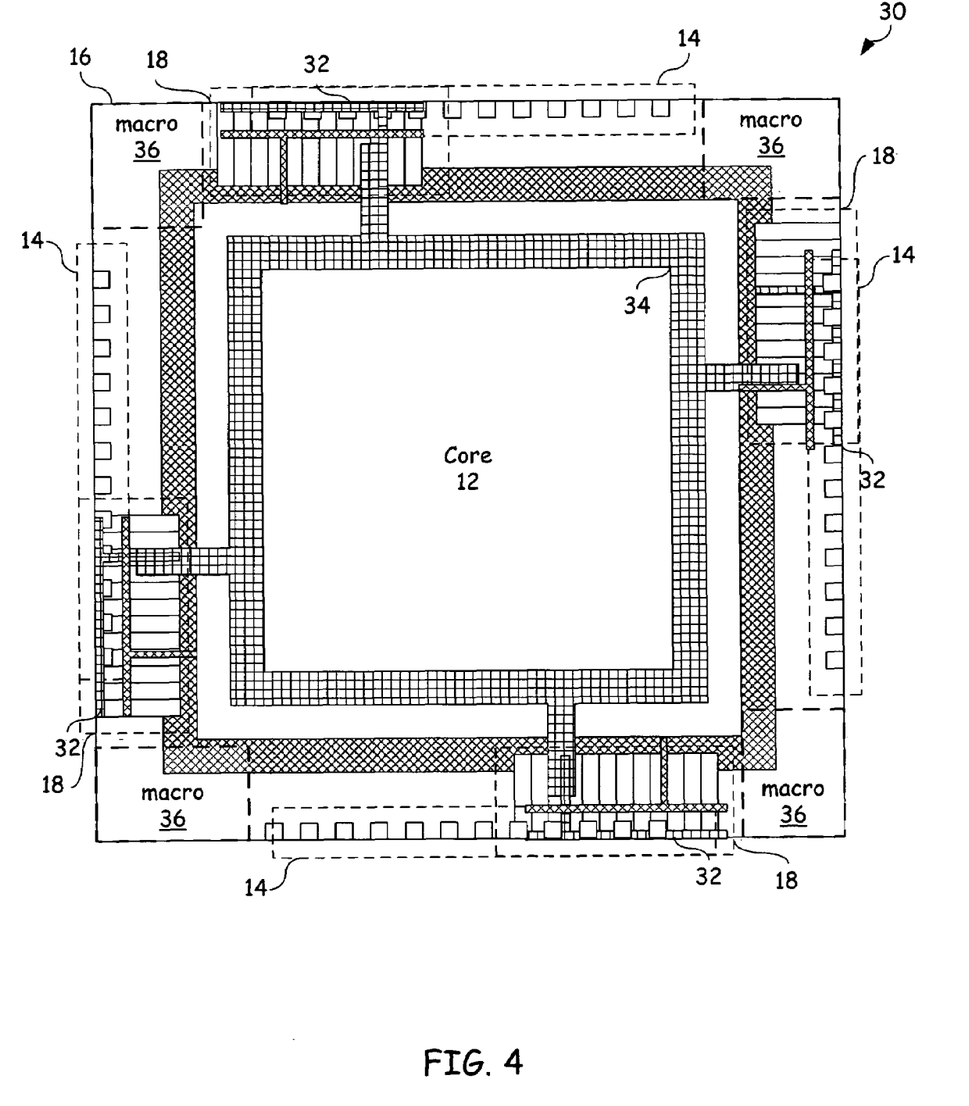
FIG. 4 provides a block diagram describing the architecture of a SoC IC having macro processing circuits located outside the core in accordance with an embodiment of the present invention.

Embodiments of the present invention create I/O power/ground distribution networks 32, which may be located on the upper level conductive layers, such as on upper 2 layers of metal in a 6 metal layer chip. These I/O power/ground distribution networks 32 may be closely connected to the I/O ring 34. In the basic case a power/ground ring 34 would completely be internal to the existing I/O rings 19 and 21. The external power ring would be designed so that resistance to any I/O driver from the pads meets spec. This allows the designer to tailor the power widths to what is needed rather than relying on a library of fixed bus widths. FIG. 4 depicts that within this architecture macros 36, such as memory macros may be located at the periphery of the die.

Non pad-limited designs can realize area savings using these methods as well. I/O drivers can be abutted, thus saving area, and bond pads can be redistributed on upper layers of metal. Since the upper layer of I/Os are stripped of power busing this area is available for signal pad redistribution; redistribution to bond pads occurs as much as possible over the I/O ring itself. Table 1 provides an example of area reduction.

TABLE 1 area savings from using one approach disclosed here for various chip designs.

| | | | chip core size | | IO | | Pad | | Chip size (IO ring) | | Chip size (dis closed) | | Area savings |
|---|---|---|---|---|---|---|---|---|---|---|---|---|---|
| | | #IOs | X (mm) | Y (mm) | X (um) | Y (um) | X (um) | Y (um) | X (mm) | Y (mm) | X (mm) | Y (mm) | % |
| Standard Pad | | 100 | 5 | 5 | 80 | 125 | 60 | 60 | 5.42 | 5.42 | 5.20 | 5.20 | 8.65% |
| | pad limited design | 200 | 5 | 5 | 80 | 125 | 60 | 60 | 5.42 | 5.42 | 5.36 | 5.35 | 2.51% |
| Pad over active | | 100 | 5 | 5 | 80 | 125 | 60 | 60 | 5.3 | 5.3 | 5.15 | 5.15 | 5.94% |
| | pad limited design | 200 | 5 | 5 | 80 | 125 | 60 | 60 | 5.3 | 5.3 | 5.26 | 5.26 | 1.67% |
| Standard Pad | | 100 | 4 | 4 | 80 | 125 | 60 | 60 | 4.42 | 4.42 | 4.24 | 4.24 | 8.82% |
| | pad limited design | 180 | 4 | 4 | 80 | 125 | 60 | 60 | 4.42 | 4.42 | 4.39 | 4.39 | 1.45% |
| Pad over active | | 100 | 4 | 4 | 80 | 125 | 60 | 60 | 4.3 | 4.3 | 4.18 | 4.18 | 6.04% |
| | pad limited design | 180 | 4 | 4 | 80 | 125 | 60 | 60 | 4.3 | 4.3 | 4.28 | 4.28 | 0.87% |

Power busing across I/Os supplies power/ground current throughout ring. Where the I/O ring must be broken, due to macro placement or different I/O libraries, each I/O ring segment must have sufficient power/ground pads to meet that segments SSO and power/ground distribution requirements. With the proposed approach, all of the previously segmented portions of the I/O ring can have their power bussing connected via the large current handling internal power/ground distribution plan. This may result in reduced number of power/ground pads since each pad contributes to the entire ring as opposed to only a portion or segment of the I/O ring.

Generally, metal routing congestion lessens the further the distance from the standard cell area. I/O rings are located near the periphery, away from standard cell areas. With this approach "custom" power routing that encroaches on the standard cell area does so over the least congested areas; periphery of standard cell area, where it is less likely to cause issues.

Many designs have a considerable amount of IP, memories, CPUs, on chip regulators, etc, which are designed using less metal layers than are available in the process. Further, these macros may be placed towards the periphery of the chip for routing congestion reasons. Having the macros at the periphery allows the proposed I/O power distribution to be created over the top of these macros, on the unused and on obstructed metal layers of these macros.

FIG. 3 provides a simplified diagram of an IC 30. Integrated circuit 30 includes a long distance power and ground distribution network 34, and an input-output (IO) power and ground distribution network 32, a number of macro circuit modules 36, and a number of IO drivers 18 and IO pads 14. Long distance power and ground distribution network 34 electrically couples to the IO power and ground distribution network's 32. These IO power and ground distribution networks may be located within the upper level of conductive layers, such as metal layers 5 and 6 of a multi-level metal system or IC. This IO power and ground distribution network to locally supply power and ground to IO circuits 18. Macros 36 may be located within the lower level conductive layers of the IC, wherein a portion of the macro are beneath the IO power and ground distribution networks. Macros 36 may be memory, on-chip regulators, processors, logic circuits, memory circuits, or other like or other known circuits. When macros 36 are memory circuits, these may only involve the lower level conductive layers. However, when logic circuits are involved and macros 36 are located at the periphery of IC 30, it may be necessary to interrupt or segment the long distance power and ground distribution network 34. Such an embodiment is shown in FIG. 5, where long distance power and ground distribution network 34 has been segmented, and it is not the conventional IO ring illustrated in FIGS. 1, 3 and 4.

Figure 5:
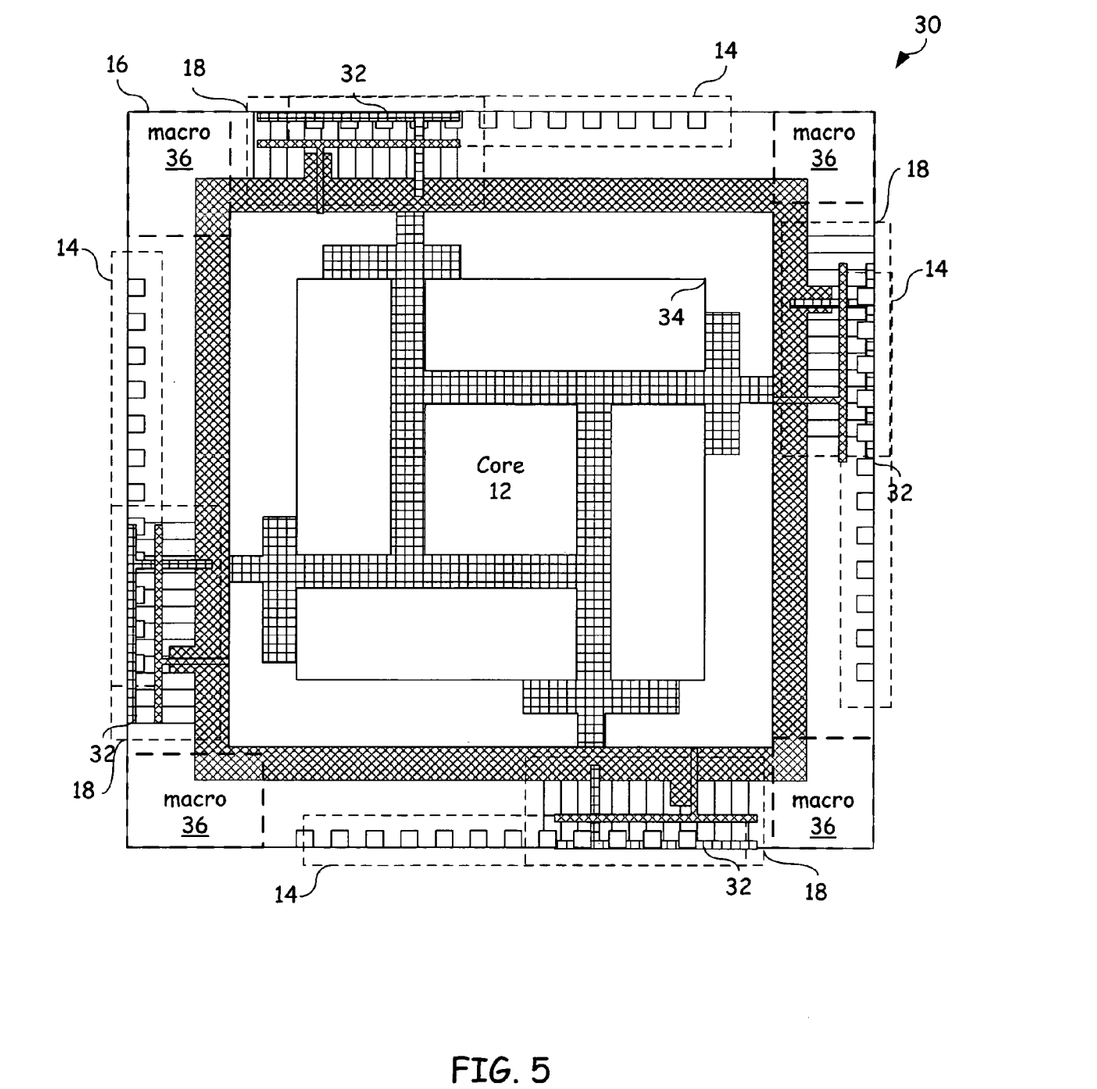
FIG. 5 provides a block diagram describing the architecture of a SoC IC having macro processing circuits located outside the core and a segmented power and ground distribution network in accordance with an embodiment of the present invention.

Unlike FIG. 4, the macros of FIG. 5 may require access to the upper level conductive layers. Hence, the long distance power and ground distribution network of FIG. 5 is segmented. In FIG. 5, as shown in FIGS. 4 and 5, macro-processing circuits may be located radially outward from some of the IO circuits, in order to avoid wasted silicon area. Reducing wasted silicon area may increase overall process yields, i.e., die per wafer, thus reducing costs associated with IC fabrication.

Figure 6:
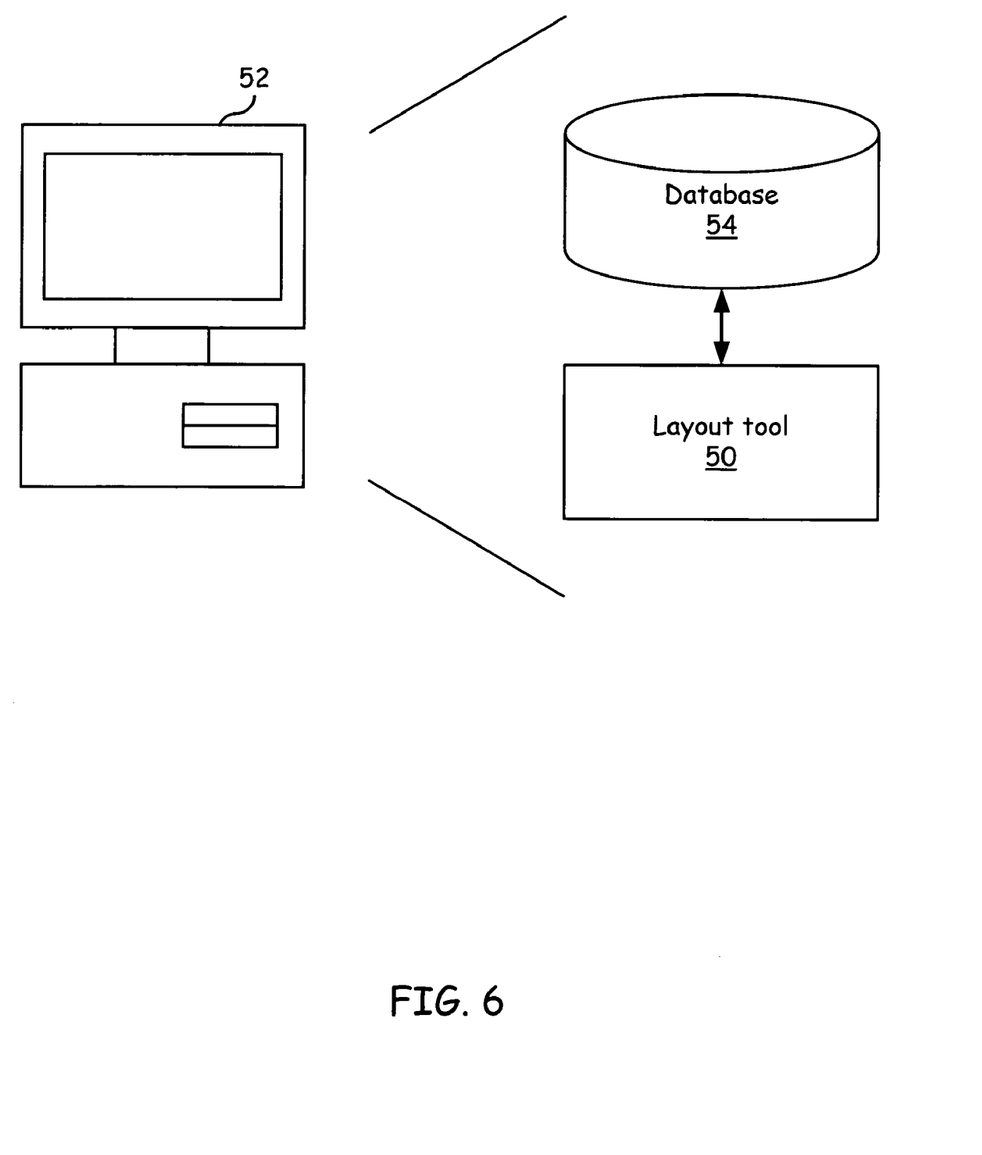
FIG. 6 describes a layout tool operable to be implemented within a computer system in accordance with an embodiment of the present invention.

To affect the layout of conductive traces such as those discussed with respect to reference FIGS. 2-5, IC designers often use layout tools to ensure the compliance with and automate the layout of the various IC layers in accordance with the design rules associates with fabrication of a particular IC. FIG. 6 depicts a layout tool 50 that may be implemented with a computer or processing system 52. Processing systems 52 can be any suitable computer-processing device that includes memory for storing and executing logic instructions, and is capable of interfacing with other processing systems. In some embodiments, processing systems 52 can also communicate with other external components via an attached network. Various input/output devices, such as keyboard and mouse (not shown), can be included to allow a user to interact with components internal and external to processing systems. Additionally, processing systems 52 can be embodied in any suitable computing device, and so include personal data assistants (PDAs), telephones with display areas, network appliances, desktops, laptops, X-window terminals, or other such computing devices. Logic instructions executed by processing systems 52 can be stored on a computer readable medium, or accessed by/transmitted to processing systems 52 in the form of electronic signals. Processing systems 52 can be configured to interface with each other, and to connect to external a network via suitable communication links such as any one or combination of T1, ISDN, or cable line, a wireless connection through a cellular or satellite network, or a local data transport system such as Ethernet or token ring over a local area network. The logic modules, processing systems, and circuitry described herein may be implemented using any suitable combination of hardware, software, and/or firmware, such as Field Programmable Gate Arrays (FPGAs), Application Specific Integrated Circuit (ASICs), or other suitable devices. The logic modules can be independently implemented or included in one of the other system components. Similarly, other components have been discussed as separate and discrete components. These components may, however, be combined to form larger, smaller, or different software modules, integrated circuits, or electrical assemblies, if desired.

Layout tools are software suites or packages that may include layout, verification, places out, schematic capture, and industry standard database conversion and support tools. Layout tools 50 facilitate the intricate layout design of ICs through the use of attached data buses 54. Layout tools in accordance with an embodiment of the present invention further facilitate IC design by allowing the die size to be reduced.

Figure 7:
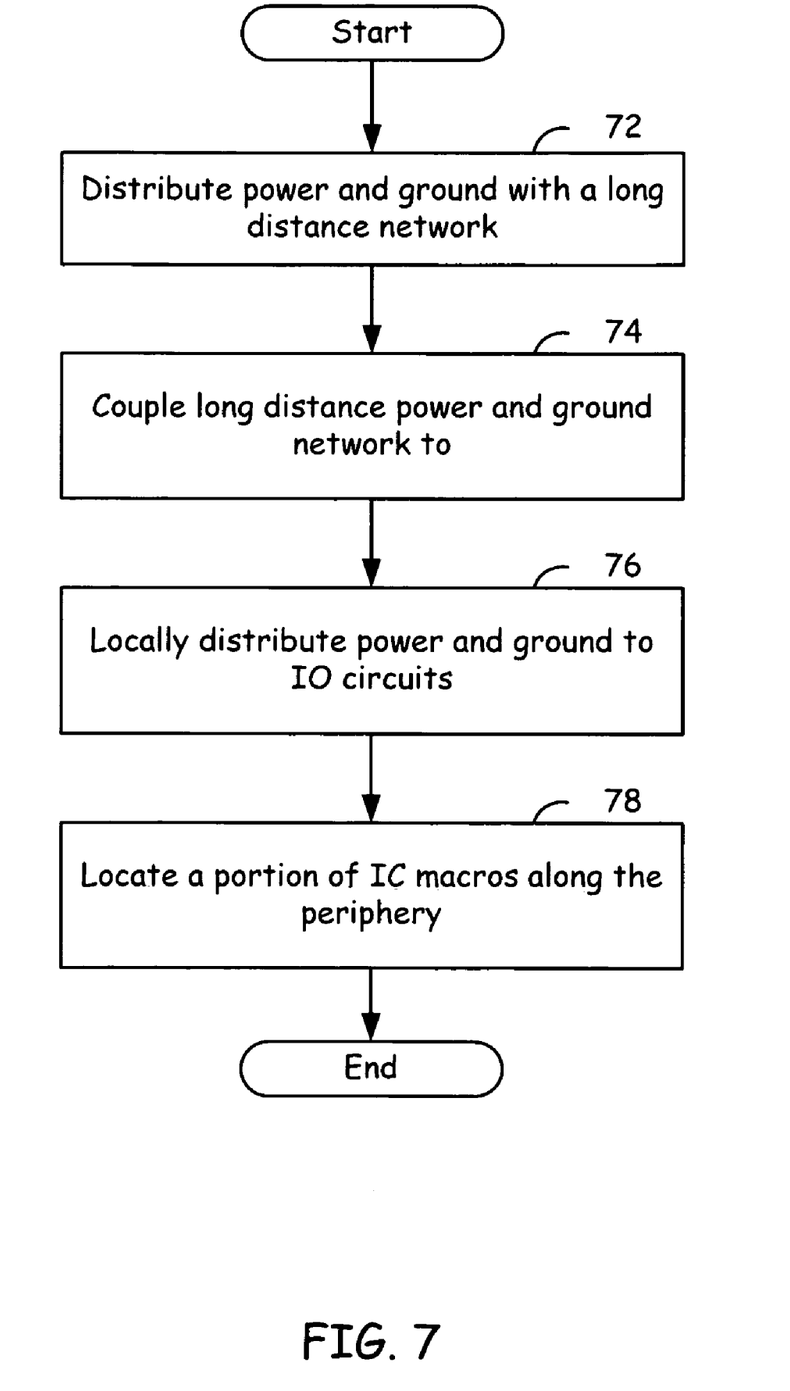
FIG. 7 provides a logic flow diagram illustrating power distribution processes associated with an IC layout in accordance with an embodiment of the present invention.

FIG. 7 provides a method to distribute power and ground to IO circuits within an IC. This method includes distributing power and ground with a long distance power and ground distribution network in step 72. An IO power and ground distribution network is then electrically coupled to the long distance power and ground distribution network in Step 74. Power and ground are then locally distributed to the IO circuits in Step 76. The IO power and ground distribution network, as well as the long distance power and ground distribution network, may be located within upper level conductive layers of the IC. This allows macro-processing circuits, such as logic, memory, and mixed signal, or other like circuits, to be located at the periphery of the IC. Typically, when macro-processing circuits are located at the periphery of the IC in Step 78, these macro-processing circuits may be located within lower level conductive layers. This allows a portion of the macro-processing circuits to be located beneath the power and ground distribution networks. However, in other instances, it may be necessary to utilize upper level conductive layers for the macro-processing circuits. When this is necessary, it may be further necessary to segment the power and ground distribution networks. These non-contiguous segments may be designed and laid out such that the individual IO segments meet local simultaneous switching output (SSO) impedance requirements.

Figure 8:
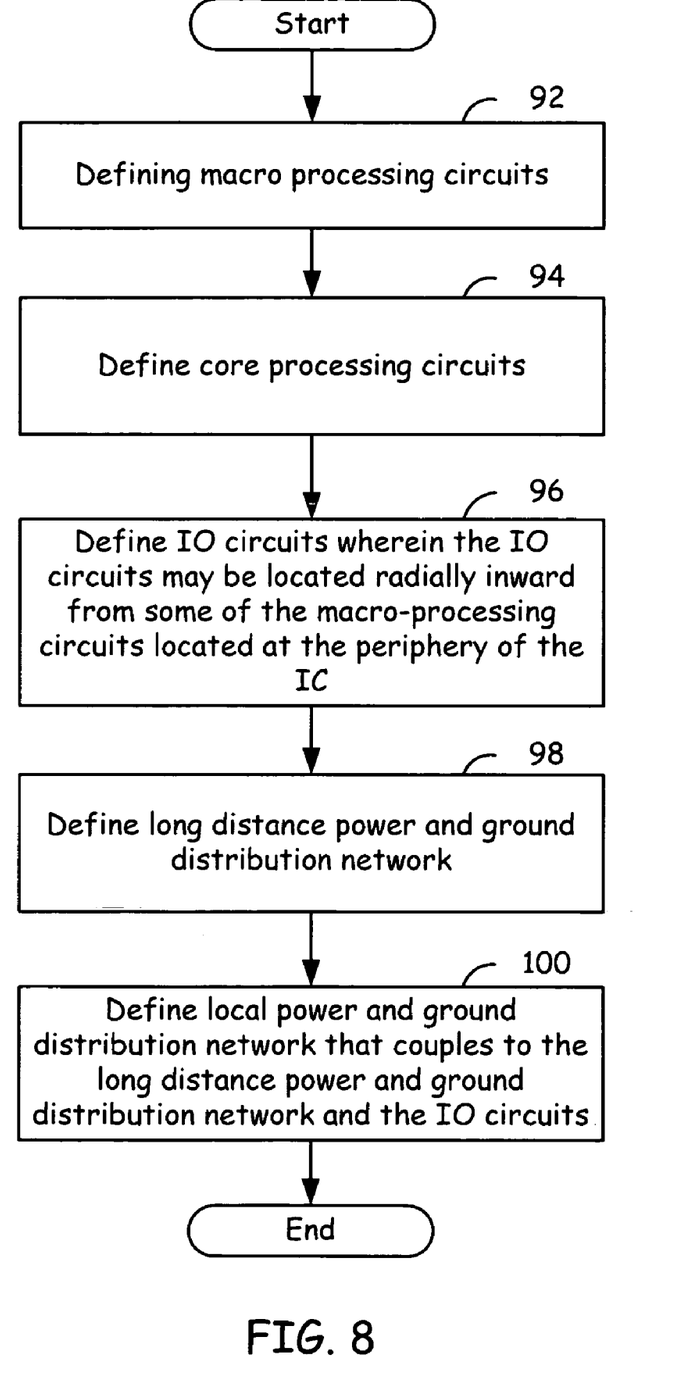
FIG. 8 provides a logic flow diagram illustrating the processes associated with layout associated with the design of an IC in accordance with an embodiment of the present invention.

Another embodiment may utilize a layout tool to implement IC design and layout. This may involve, in Step 92, the defining macro-processing circuits. As stated previously, these macro-processing circuits are typically located within the lower level conductive layers, such as metal layers 1 through 4 of a 6-metal-layer IC. A portion of these macro-processing circuits, as previously stated, may be located at or near the periphery of the IC. Core processing circuits are defined in Step 94. Step 96 defines IO circuits wherein the IO circuits may be located radially inward from some of the macro-processing circuits located at the periphery of the IC. Step 98 defines a long distance power and ground distribution network operable to supply power to the macro-processing circuits and core processing circuits. Step 100 defines an IO power and ground distribution network that couples to the long distance power and ground distribution network, wherein the IO power and ground distribution network is located within the upper level conductive layers, wherein it should be noted that the long distance and IO power and ground distribution networks may typically be located within the upper level conductive layers.

In summary, embodiments of the present invention provide an IC in which power to IO drivers may be distributed within unused areas over macro processing circuits. This results in a smaller IC, better control to minimize noise resulting from simultaneous switching outputs (SSO) and may enable further area reduction through a reduced number of required power pads. This IC includes a long distance power and ground distribution network, an IO power and ground distribution network, a number of processing circuits, and IO circuits. The long distance power and ground distribution network electrically couples to the IO power and ground distribution network. Both the power and ground distribution networks may be located within the upper level conductive layers. IO power and ground distribution network locally supplies power and ground to IO circuits. Macro processing circuits may be located beneath the power distribution network as some macro processing circuits do not require access to upper level conductive layers. By placing these macro processing circuits beneath these power distribution networks, die size may be reduced and the yield, i.e. die per wafer, may be increased.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

Although the present invention is described in detail, it should be understood that various changes, substitutions and alterations can be made hereto without departing from the spirit and scope of the invention as described by the appended claims.

What is claimed is:

1. An integrated circuit (IC), comprising;
   a long distance power and ground distribution network disposed within an interior portion of the IC for power and ground distribution to core circuitry resident within the interior portion of the IC;
   an input/output (I/O) power and ground distribution network disposed along outer edges of the IC and electrically localized for coupling to select number of localized I/O circuits that are also disposed along the outer edges of the IC, in which each localized I/O power and ground distribution portion of the network is electrically coupled to the long distance power and ground distribution network, wherein both long distance power and ground distribution network and I/O power and ground distribution network are located within upper level conductive layers, and wherein each localized I/O power and ground distribution portion of the network is operable to locally supply power and ground to corresponding local I/O circuits; and
   a plurality of macro processing circuits also disposed along outer edges of the IC, wherein the macro processing circuits are located within lower level conductive layers.

2. The IC of claim 1, wherein the macro processing circuits comprise at least one circuit selected from the group consisting of:
   memory;
   on chip regulators;
   memory macros; and
   processors.

3. The IC of claim 1, wherein the upper level conductive layers comprise metal layers 5 and 6.

4. The IC of claim 1, wherein the lower level conductive layers comprise metal layers 1 through 4.

5. The IC of claim 1, wherein the long distance power and ground distribution network receives power and ground from a connection to an IC package.

6. The IC of claim 1, wherein the long distance power and ground distribution network comprises a power ring; and the I/O circuits and corresponding localized I/O power and ground distribution network comprise an I/O ring.

7. The IC of claim 6, wherein the I/O ring comprises non-contiguous I/O segments, and wherein each non-contiguous I/O segment meets local simultaneous switching output (SSO) impedance requirements.

8. The IC of claim 1, wherein at least a portion of the plurality of macro processing circuits are located radially outward from the I/O circuits.

9. A method to distribute power and ground to input/output (I/O) circuits within an integrated circuit (IC), the method comprising:
   distributing power and ground with a long distance power and ground distribution network disposed within an interior portion of the IC for power and ground distribution to core circuitry resident within the interior portion of the IC; and distributing power and ground to an I/O power and ground distribution network that is coupled to the long distance power and ground distribution network, in which the I/O power and ground distribution network is disposed along outer edges of the IC and electrically localized for coupling to select number of localized I/O circuits that are also disposed along the outer edges of the IC, wherein each localized I/O power and ground distribution portion of the network is operable to locally supply power and ground to corresponding local I/O circuit.

10. The method of claim 9, wherein the I/O power and ground distribution network is located within upper level conductive layers of the IC.

11. The method of claim 10, further comprising locating a plurality of macro processing circuits at the edges of the IC, wherein the macro processing circuits are located within lower level conductive layers.

12. The method of claim 11, wherein the macro processing circuits comprise at least one circuit selected from the group consisting of:
  memory;
  on chip regulators;
  memory macros; and
  processors.

13. The method of claim 11, wherein the upper level conductive layers comprise metal layers 5 and 6.

14. The method of claim 11, wherein the lower level conductive layers comprise metal layers 1 through 4.

15. The method of claim 9, further comprising electrically coupling the long distance power and ground distribution network to an external source through an IC package.

16. The method of claim 9, wherein the long distance power and ground distribution network comprises a power ring; and the I/O circuits and corresponding localized I/O power and ground distribution network comprise an I/O ring.

17. The method of claim 16, wherein the I/O ring comprises non-contiguous I/O segments, and wherein each non-contiguous I/O segment meets local simultaneous switching output (SSO) impedance requirements.

18. The method of claim 9, wherein at least a portion of the I/O circuits are located radially inward from a plurality of macro processing circuits.

* * * * *